(12) United States Patent
Shinoda et al.

(10) Patent No.: US 9,443,750 B2
(45) Date of Patent: Sep. 13, 2016

(54) DICING SHEET WITH PROTECTIVE FILM-FORMING LAYER, AND METHOD FOR PRODUCING CHIP

(71) Applicant: LINTEC Corporation, Tokyo (JP)

(72) Inventors: Tomonori Shinoda, Tokyo (JP); Ken Takano, Tokyo (JP)

(73) Assignee: LINTEC Corporation, Tokyo (JP)

( * ) Notice: Subject to any disclaimer, the term of this patent is extended or adjusted under 35 U.S.C. 154(b) by 0 days.

(21) Appl. No.: 14/368,591

(22) PCT Filed: Dec. 25, 2012

(86) PCT No.: PCT/JP2012/083478
§ 371 (c)(1),
(2) Date: Jun. 25, 2014

(87) PCT Pub. No.: WO2013/099869
PCT Pub. Date: Jul. 4, 2013

(65) Prior Publication Data
US 2015/0024576 A1 Jan. 22, 2015

(30) Foreign Application Priority Data
Dec. 26, 2011 (JP) .................................. 2011-283430

(51) Int. Cl.
*H01L 21/683* (2006.01)
*H01L 23/544* (2006.01)
(Continued)

(52) U.S. Cl.
CPC ............. *H01L 21/6836* (2013.01); *B32B 7/06* (2013.01); *C09J 7/0228* (2013.01); *H01L 21/78* (2013.01); *H01L 23/544* (2013.01);
(Continued)

(58) Field of Classification Search
CPC . H01L 21/6836; H01L 21/78; H01L 23/544; B32B 7/06; C09J 7/0228
See application file for complete search history.

(56) References Cited

U.S. PATENT DOCUMENTS 7,514,143 B2 * 4/2009 Matsumura et al. ......... 428/354
7,517,724 B2 * 4/2009 Hatakeyama et al. ........ 438/114
(Continued)

FOREIGN PATENT DOCUMENTS

JP  2002280329 A  9/2002
JP  2006140348 A  6/2006
(Continued)

OTHER PUBLICATIONS

English Abstract of JP2009138026. Espacenet, Accessed Jan. 30, 2015; 1 page.
(Continued)

*Primary Examiner* — John P Dulka
(74) *Attorney, Agent, or Firm* — Cahn & Samuels, LLP

(57) ABSTRACT

A dicing sheet with a protective film-forming layer includes a protective film-forming layer on an adhesive layer of an adhesive sheet with a peel strength adjusting layer being interposed therebetween. The adhesive sheet is composed of a base film and the adhesive layer. The dicing sheet with a protective film-forming layer may also include a laminate of the peel strength adjusting layer and the protective film-forming layer arranged in the inner circumferential part of the adhesive sheet; the adhesive layer is exposed in the outer circumferential part of the adhesive sheet; and the peel strength between the peel strength adjusting layer and a protective film that is obtained by curing the protective film-forming layer is 0.05-5 N/25 mm.

11 Claims, 1 Drawing Sheet

(51) Int. Cl.
*C09J 7/02* (2006.01)
*B32B 7/06* (2006.01)
*H01L 21/78* (2006.01)

(52) U.S. Cl.
CPC .... *C09J 2201/622* (2013.01); *C09J 2203/326* (2013.01); *H01L 2221/68327* (2013.01); *H01L 2221/68377* (2013.01); *H01L 2223/54406* (2013.01); *H01L 2223/54486* (2013.01); *H01L 2924/0002* (2013.01); *Y10T 428/24802* (2015.01)

(56) References Cited

U.S. PATENT DOCUMENTS

| | | |
|---|---|---|
| 2002/0137309 A1 | 9/2002 | Senoo et al. |
| 2005/0184402 A1 | 8/2005 | Senoo et al. |
| 2006/0102987 A1* | 5/2006 | Saiki et al. .................. 257/632 |
| 2007/0120271 A1* | 5/2007 | Kozakai et al. .............. 257/779 |

FOREIGN PATENT DOCUMENTS

| | | |
|---|---|---|
| JP | 2009138026 A | 6/2009 |
| JP | 2011054707 A | 3/2011 |

OTHER PUBLICATIONS

International application No. PCT/JP20121083478, Notification of Transmittal of Translation of the International Preliminary Report on Patentability, dated Jul. 10, 2014.

English Abstract of JP2006140348. Espacenet; Accessed Jan. 30, 2015; 2 pages.

English Abstract of JP2002280329. Espacenet; Accessed Jan. 30, 2015; 2 pages.

English Abstract of JP2011054707. Espacenet; Accessed Jan. 30, 2015; 2pages.

* cited by examiner

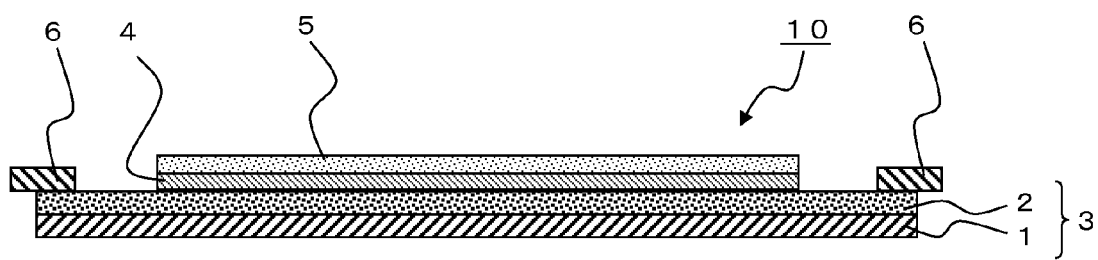

DICING SHEET WITH PROTECTIVE FILM-FORMING LAYER, AND METHOD FOR PRODUCING CHIP

This application is a U.S. national stage application of PCT/JP2012/083478 filed on 25 Dec. 2012, and claims priority of Japanese patent document 2011-283430 filed on 26 Dec. 2011, the entireties of which are incorporated herein by reference.

TECHNICAL FIELD

The present invention relates to a dicing sheet with a protective film forming layer capable of forming a protective film at the backside of the chip and also capable of improving the production efficiency of the chip. Also, the present invention relates to a production method of the chip using the dicing sheet with the protective film forming layer.

BACKGROUND OF THE INVENTION

Recently, the production of the semiconductor device using the mounting method of so called "face down method" is carried out. In the face down method, the semiconductor chip (hereinafter, it may be referred as "chip") having electrodes such as bumps or so on the circuit surface is used, and said electrodes are bonded with the substrate. Therefore, the face of the opposite side of the circuit face of the chip (the backside of the chip) will be exposed.

The chip backside which has been exposed may be protected by an organic film. Conventionally, the chip having the protective film made of this organic film was obtained by coating the liquid resin on the wafer backside by a spin coat method, then drying and curing followed by cutting the protective film together with the wafer. However, the accuracy of the thickness of the protective film formed as such was not sufficient, hence the yield rate of the product declined in some case.

In order to solve the above problem, the chip protection film having the release sheet, and a protective film forming layer consisting of an energy ray curable component and a binder polymer component which are formed on said release sheet is proposed (Patent article 1).

Further, the semiconductor chip has become thinner and has higher density recently, thus even higher reliability is requested for the semiconductor chip mounted with the protective film when it is exposed to a harsh temperature condition.

According to the study by the present inventors, the chip protective film described in the patent document 1 shrunk when curing the protective film forming layer, and had problem of the semiconductor warpage or so in some case. Particularly, such problem was prominent for the extremely thin semiconductor wafer. When the semiconductor wafer warpage occurred, the wafer may be damaged, or the marking (the printing) accuracy to the protective film may decline. Also, for the chip protective film described in the patent document 1, when producing the chip with the protective film, the wafer with the protective film is adhered to the dicing sheet, and the wafer needs to be diced, hence the production steps are complicated.

Thus, the warpage of the wafer can be prevented by taking the constitution wherein the protective film forming layer cut out to a same shape in advance as the wafer is provided on the adhesive layer of the dicing sheet made of a base film and the adhesive layer, since the outer peripheral part of the sheet can be adhered and fixed to the ring frame. Also, the dicing can be carried out while being fixed as such, hence even after the curing of the protective film forming layer, there is no need to carry out the dicing by additionally adhering the dicing sheet, thus the production steps can be simplified.

[Patent Article 1] JP Patent Application Laid Open No. 2009-138026

SUMMARY OF INVENTION

However, in the dicing sheet with the protective film forming layer having the above mentioned constitution, the adhesive layer and the protective film forming layer may fuse during the thermosetting step of the protective film forming layer; hence there may be a possibility that the protective film and the adhesive layer can not be released at the boundary after the wafer is separated by dicing. Also, even in case the protective film forming layer is provided directly to the base film without providing the adhesive layer, the base film may adhere, and the release of the protective film may become difficult, or the protective film or the chip may be damaged. Also, on the other hand, in case the adhesiveness between the protective film and the base film is too low, the protective film and the wafer may not be fixed sufficiently during the dicing step, the chip with the protective film may move due to the force applied by the dicing blade.

The present invention was accomplished in view of such circumstance. That is, the object of the present invention is to provide the dicing sheet with the protective film forming layer capable of easily producing the semiconductor chip having high uniformity and the protective film with excellent printing accuracy; can easily carryout the release between the protective film and the base film; and having excellent ability of fixing the chip during the dicing.

The present invention includes the following gist.

(1) A dicing sheet with a protective film forming layer comprising an adhesive sheet formed of a base film and an adhesive layer, wherein the protective film forming layer is formed on the adhesive layer via a release strength adjusting layer, a multilayered body formed of the release strength adjusting layer and the protective film forming layer is formed at an inner peripheral part of the adhesive sheet, and the adhesive layer is exposed at an outer peripheral part of the adhesive sheet and the release strength between the release strength adjusting layer and a protective film formed by curing the protective film forming layer is 0.05 to 5 N/25 mm.

(2) The dicing sheet with the protective film forming layer as set forth in (1) wherein a thermal shrinkage ratio of the release strength adjusting layer under heating at 130° C. for 2 hours is −5 to +5%.

(3) The dicing sheet with the protective film forming layer as set forth in (1) or (2), the thermal shrinkage ratio of the base film under the heating at 130° C. for 2 hours is −5 to +5%.

(4) The dicing sheet with the protective film forming layer as set forth in any one of (1) to (3), wherein a total light transmittance of the multilayered body formed of the adhesive sheet and the release strength adjusting layer is 70% or more at a wave length of 532 nm and 1064 nm.

(5) The dicing sheet with the protective film forming layer as set forth in any one of (1) to (4), wherein said protective film forming layer comprises a binder polymer component and a curable component.

(6) The dicing sheet with the protective film forming layer as set forth in any one of (1) to (5), wherein said protective film forming layer comprises a coloring agent, and the maximum transmittance of the protective film forming layer is 20% or less at the wave length of 300 to 1200 nm.

(7) A production method of a chip wherein the protective film forming layer of the dicing sheet as set forth in any one of (1) to (6) is adhered to a workpiece, and following steps (1) to (3) is carried out in this order:

Step (1): obtaining the protective film by curing the protective film forming layer, Step (2): dicing the workpiece, and the protective film forming layer or the protective film, Step (3): releasing the protective film forming layer or the protective film from the release strength adjusting layer.

(8) The production method of the chip as set forth in (7), wherein following step (4) is carried out at any time after said step (1).

Step (4): laser printing on the protective film.

(9) The production method of the chip as set forth in (7) or (8) wherein the release strength adjusting layer is carried out with a full cut at said step (2).

By using the dicing sheet with the protective film forming layer according to the present invention when forming the protective film at the backside of the semiconductor chip, the release between the protective film and the base film can be carried out easily, the movement of the chip during the dicing is suppressed, and the protective film having high uniformity and excellent printing accuracy can be formed at the semiconductor chip backside.

BRIEF DESCRIPTION OF THE DRAWINGS

FIG. 1 is a cross section of the dicing sheet with the protective film forming layer according to the present invention.

DETAILED DESCRIPTION OF THE INVENTION

Hereinafter, the present invention will be described in detail including the best mode thereof. As shown in FIG. 1, the dicing sheet 10 with the protective film forming layer according to the present invention comprises; the adhesive sheet formed of the base film 1 and the adhesive layer 2, and the protective film forming layer 5 formed on the adhesive layer 2 via the release strength adjusting layer 4; the multilayered body formed of the release strength adjusting layer 4 and the protective film forming layer 5 at the inner peripheral part of the adhesive sheet 3; and the adhesive layer 2 is exposed to the outer peripheral part of the adhesive sheet 3. That is, multilayered body formed of the release strength adjusting layer 4 and the protective film forming layer 5 having a smaller diameter than the adhesive sheet 3 is stacked on the adhesive layer 2 of the circular adhesive sheet 3 in a concentric circle. The exposed outer peripheral part of the adhesive layer is used for the fixing of the ring flame 6 as shown in FIG. 1.

(The Base Film 1)

The base film 1 of the present invention is not particularly limited, and specifically, the melting point is higher than 130° C., or it does not have the melting point. Also, preferably, the thermal shrinkage ratio of the base film under the heating at 130° C. for 2 hours is preferably −5 to +5%. If the melting point of the base film is 130° C. or less, or if the thermal shrinkage ratio is out of the above mentioned range, the base films melts or shrink when curing the protective film forming layer, and it may become difficult to maintain the shape of the base film. Also, the base film may fuse with the surrounding device during the step of producing the semiconductor chip. Furthermore, the deformation of the protective film forming layer caused by the melting or shrinking of the base film may cause the decline of the printing accuracy to the protective film; hence the dicing aptitude may be compromised. Further, after the dicing, if the deformation to the longitudinal direction or horizontal direction of the adhesive sheet occurs, the chip alignment may decline, and the pickup aptitude may be compromised. Note that, by referring "not having the melting point", this means that the melting point is higher than the firing temperature of the resin.

Also, in either of MD direction of the base film (the direction along the direction of carrying the film when the film is made in a belt shape), and CD direction of the base film (the direction perpendicular to the MD direction on the same face of the film), the rupture elongation of the tensile test is 100% or more, and the stress at 25% elongation of the base film is preferably 100 MPa or less. By having the base film within such range, in case the release strength adjusting layer is completely cut during the dicing, the dicing sheet exhibits excellent expand aptitude.

The melting point of the base film is preferably 140° C. or higher or has no melting point; and more preferably the melting point is 200° C. or higher or has no melting point. Also, the thermal shrinkage ratio of the base film under the heating at 130° C. for 2 hours is preferably −4% to +4%. By having the melting point and the thermal shrinkage ratio of the base film within the above range, the base film has excellent heat resistance, and the shape holding property of the base film is maintained in a good condition when the above mentioned protective film forming layer is cured. The thermal shrinkage ratio of the base film under the heating at 130° C. for 2 hours can be obtained by the following formula using the area of the base film which is before and after the introduction of the base film into 130° C. environment.

The thermal shrinkage ratio (%)={(the area of the base film before the introduction)−(the area of the base film after introduction)}/the area of the base film before introduction×100

Also, the stress at 25% elongation of the base film can be obtained by dividing the force when elongating the base film by 25% with the cross section area of the film.

Also, the rupture elasticity of MD direction and CD direction of the base film is preferably 120% or higher, and more preferably 250% or higher. The stress at 25% elongation of the base film is preferably 80 MPa or less, and more preferably 70 MPa or less. By having the rupture elongation and the stress at 25% elongation within the above mentioned range, the dicing sheet shows good expanding property, and also the pickup malfunction or the chip breakage can be suppressed which are caused by the contact between the adjacent chips during the pickup.

As the base film, for example, polypropylene film, polybutyleneterephthalate film, acrylic resin film, a heat resistance polyurethane film or so may be mentioned. Also, a crosslinking film or the film modified by a radiation electric discharge and so on may be used as well. The base film may be a multilayered body of the above mentioned films as long as it satisfies the above mentioned physical properties.

The thickness of the base film is not particularly limited, and preferably it is 30 to 300 μm, and more preferably 50 to 200 μm. By having the thickness of the base film within said range, it exhibits sufficient expanding property even after the cutting during the dicing. Also, since the dicing sheet with the protective film forming layer has sufficient flexibility, it exhibits excellent adherence against the workpiece (for example, the semiconductor wafer or so).

(The Adhesive Layer 2)

The adhesive layer of the present invention can be obtained by various known adhesives. As such adhesive agent, it is not particularly limited, and for example, the adhesives agent of a rubber based, an acrylic based, a silicone based, polyvinylether or so can be used. Also, the adhesive agent of the energy ray curable type or the heat foaming type, and the water swelling type can be used as well. As the energy ray curable (the ultraviolet ray curable, the electron beam curable) adhesive agent, it is particularly preferable to use the ultraviolet ray curable adhesive agent.

The adhesive agent layer is adhered to the ring frame at the outer peripheral part thereof when producing the chip which will be described in the following. When the curing of the protective film forming layer is carried out by adhering the peripheral part of the adhesive layer to the ring frame, the adhesives may remain on the ring frame when the ring frame is released from the adhesive layer. Also, during the curing step of the protective film forming layer, the adhesive layer may soften by being exposed under a high temperature, and the adhesive agent tends to remain easily. Therefore, among the above mentioned adhesive agent, from the point of preventing the adhesive agent from remaining on the ring frame, and to provide a heat resistance to the adhesive layer, the adhesive agent of acrylic based and the silicone based are preferable.

Also, the adhesive force (the adhesive force to the SUS board following the heating under 130° C. for 2 hours after being adhered) of the adhesive layer of the part adhered to the ring frame (the outer peripheral part of the adhesive sheet) is preferably 15 N/25 mm or less, more preferably 10 N/25 mm or less, and particularly preferably 5 N/25 mm or less. By having the adhesive force of the adhesive layer at the part adhered to the ring frame within the above mentioned range, an excellent adhesiveness to the ring frame can be exhibited, and the adhesive agent is prevented from remaining on the ring frame.

The thickness of the adhesive layer is not particularly limited, however preferably it is 1 to 100 μm, more preferably 2 to 80 μm, and particularly preferably 3 to 50 μm.

The method of providing the adhesive layer on the base film surface may be a method of transferring the adhesive layer, which is formed by coating on the release sheet in a predetermined film thickness, to the base film; or it may be a method of forming the adhesive layer by directly coating the adhesive composition constituting the adhesive layer to the base film surface. As for the release sheet, those which are as same as the one provided on the protective film forming layer which will be described in the following can be used. As such, by providing the adhesive layer on the base film, the adhesive sheet 3 can be obtained.

(The Release Strength Adjusting Layer 4)

The release strength adjusting layer 4 of the present invention is introduced between the adhesive layer and the protective film forming layer in order to make the release of the chip with the protective film easy from the dicing sheet with the protective film forming layer. The release strength between the release strength adjusting layer and the protective film is 0.05 to 5 N/25 mm. The release strength between the release strength adjusting layer and the protective film is measured as follows. First, the dicing sheet with the protective film forming layer is cut into the width of 25 mm, then after adhering the protective film forming layer to the silicon mirror wafer, it is cured. The curing is carried out by applying the heat if the protective film forming layer is thermosetting type; and the condition thereof is 130° C. for 2 hours or so. Also, if the protective film forming layer is energy ray curable, then it is cured by applying the energy ray under appropriate condition until the energy ray polymerizable group comprised therein is not substantially present. Next, the multilayered body having the base film, the adhesive layer and the release strength adjusting layer is released from the protective film under the environment of 23° C. and 60% relative humidity at the speed of 300 mm/min and 180°. In case the release strength is less than 0.05 N/25 mm, the chip with the protective film cannot be fixed during the dicing, and the chip may move. If the release strength exceeds 5 N/25 mm, the pickup of the chip with the protective film may become difficult. The release strength is preferably 0.05 to 3 N/25 mm.

In order to regulate the release strength of the release strength adjusting layer from the protective film within the above mentioned range, the material of the release strength adjusting layer is preferably selected from polyolefin based films. As the polyolefin based films have low polarity, the adhesiveness of the protective film forming layer usually using the material with high polarity does not become too high, hence it becomes easy to regulate the release strength within the above mentioned range. As the polyolefin based film, the film made of polyethylene, polypropylene, polymethylpentene, ethylene-vinyl acetate copolymer, ethylene-methacrylate copolymer, ionomer resin or so may be mentioned. Among these, from the point of accomplishing both the release strength and the heat resistance, polypropylene film is particularly preferable.

The release strength adjusting layer may be the film carried out with the release treatment. As for the film carried out with the release treatment, the same release sheet as the arbitrary constitution of the following described dicing sheet with the protective film forming layer can be used. In this case, if those having excessively high release property are selected, the release strength between the release strength adjusting layer and the protective film becomes small, and it may become below the lower limit of the above mentioned preferable range, hence it is necessary to select those having the release property which is not too high.

The release strength adjusting layer 4 of the present invention is not particularly limited, and specifically, the melting point is higher than 130° C., or it does not have the melting point. Also, preferably, the thermal shrinkage ratio under the heating at 130° C. for 2 hours is preferably −5 to +5%. If the melting point of the release strength adjusting layer is 130° C. or less, or if the thermal shrinkage ratio is out of the above mentioned range, the release strength adjusting layers melts or shrinks when curing the protective film forming layer, and it may become difficult to maintain the shape of the release strength adjusting layer. Also, the release strength adjusting layer may fuse with the surrounding device during the step of producing the semiconductor chip. Furthermore, the deformation for the protective film forming layer caused by the melting or shrinking of the release strength adjusting layer may cause the decline of the printing accuracy to the protective film.

The melting point of the release strength adjusting layer is preferably 140° C. or higher or has no melting point; and more preferably the melting point is 200° C. or higher, or has no melting point. Also, the thermal shrinkage ratio of the release strength adjusting layer under the heating at 130° C. for 2 hours is preferably −4% to +4%. By having the melting point and the thermal shrinkage ratio of the release strength adjusting layer within the above range, the release strength adjusting layer has excellent heat resistance, and the shape holding property of the release strength adjusting layer is maintained in a good condition when the above mentioned protective film forming layer is cured. Note that, the thermal shrinkage ratio of the release strength adjusting layer under the heating at 130° C. for 2 hours can be obtained by the following formula using the area of the release strength adjusting layer which is before and after the introduction of the release strength adjusting layer into 130° C. environment.

The thermal shrinkage ratio (%)={(the area of the release strength adjusting layer before the introduction)−(the area of the release strength adjusting layer after introduction)}/the area of the release strength adjusting layer before introduction×100

The thickness of the release strength adjusting layer is not particularly limited, and preferably it is 3 to 300 µm, and more preferably 5 to 150 µm. Also, the release strength adjusting layer has the shape approximately as same as the following described protective film forming layer, and also it is the same size or a size larger than the workpiece (the semiconductor wafer or so) to be adhered.

When the above mentioned release strength adjusting layer 4 is provided between the adhesive sheet 3 and the protective film forming layer 5; as the secondary effect, the obtained chip becomes difficult to shift the position when the release strength adjusting layer is not cut even after the protective film and the workpiece are cut and the protective film forming layer is cured to form the protective film. That is, even if the adhesive sheet 3 has gone through thermal deformation when curing the protective film forming layer, the deformation of the adhesive sheet 3 does not influence to alignment part of the chip, hence the alignment of the chip is maintained.

Further, when the above mentioned adhesive sheet 3 has sufficient heat resistance, and the deformation of the adhesive sheet is small under the curing condition of the protective film forming layer, the release strength adjusting layer 4 can be cut when cutting the workpiece and the protective film. By cutting the release strength adjusting layer 4, the dicing sheet of the present invention can be expanded further easily after the dicing, hence the pickup of the chip becomes easy.

(The Protective Film Forming Layer 5)

The protective film forming layer 5 of the present invention is not particularly limited, and for example the protective film forming layer of the thermosetting type, thermoplastic type, radiation curable type can be used. Among these, when using the protective film forming layer of the thermosetting type, the problem of the adhesiveness between the protective film and the adhesive layer or the base film becomes prominent, thus the effect of the present invention is exhibited preferably.

The protective film forming layer preferably comprises the binder polymer component (A) and the curable component (B).

(A) The Binder Polymer Component

In order to provide a sufficient adhesiveness and the film forming property (the sheet processing property) to the protective film forming layer, the binder polymer component (A) is used. As the binder polymer component (A), the conventionally known acrylic polymer, polyester resin, urethane resin, acrylic urethane resin, silicone resin, and the rubber based polymer or so can be used.

The weight average molecular weight (Mw) of the binder polymer component (A) is preferably 10000 to 2000000, and more preferably 100000 to 1200000. If the weight average molecular weight of the binder polymer component (A) is too low, the release strength between the protective film forming layer and the release strength adjusting layer becomes too high, and the transfer problem of the protective film forming layer may be caused; and if the weight average molecular weight is too high, then the adhesiveness of the protective film forming layer declines, and the chip may not be able to be transferred, or the protective film may fall off from the chip or so after the transferring.

As the binder polymer component (A), acrylic polymer is preferably used. The glass transition temperature (Tg) of the acrylic polymer is preferably −60 to 50° C., more preferably −50 to 40° C., and particularly preferably −40 to 30° C. If the glass transition temperature of the acrylic polymer is too low, the release strength between the protective film forming layer and the release strength adjusting layer becomes large, thus there may be a transfer malfunction of the protective film forming layer. If the glass transition temperature is too high, the adhesiveness of the protective film forming layer declines, and the chip or so may not be transferred, or the protective film may be released from the chip or so after the transferring.

As the monomer constituting the above mentioned acrylic polymer, (meth)acrylate monomer or the derivative thereof may be mentioned. For example, alkyl (meth)acrylate having carbon atoms of the alkyl group of 1 to 18, specifically, methyl (meth)acrylate, ethyl (meth)acrylate, propyl (meth)acrylate, butyl (meth)acrylate, 2-ethylhexyl (meth)acrylate or so may be mentioned. Also, (meth)acrylate having a cyclic backbone, specifically cyclohexyl (meth)acrylate, benzyl (meth)acrylate, isobornyl (meth)acrylate, dicyclopentanyl (meth)acrylate, dicyclopentenyl (meth)acrylate, diclyopentenyloxyethyl (meth)acrylate, imide (meth)acrylate or so may be mentioned. Further, as the monomer comprising the functional group, hydroxymethyl (meth)acrylate, 2-hydroxyethyl (meth)acrylate, 2-hydroxypropyl (meth)acrylate or so comprising hydroxyl group are mentioned; and glycidyl (meth)acrylate having epoxy group or so may be mentioned. As the acrylic polymer, the acrylic polymer comprising the monomer with the hydroxyl group is preferable since it has good compatibility with the curable component (B) which will be discussed in the following. Also, the above mentioned acrylic polymer may be copolymerized with acrylic acid, methacrylic acid, itaconic acid, vinyl acetate, acrylonitrile, styrene or so.

Further, as the binder polymer component (A), the thermoplastic resin may be blended in order to maintain the flexibility of the protective film after the curing. As such thermoplastic resin, those comprising the weight average molecular weight of 1000 to 100000 is preferable, and more preferably it is 3000 to 80000. The glass transition temperature of the thermoplastic resin is preferably −30 to 120° C., and more preferably −20 to 120° C. As the thermoplastic resin, polyester resin, urethane resin, phenoxy resin, polybutene, polybutadiene, polystyrene or so may be mentioned. These thermoplastic resins can be used alone or by combining two or more thereof. By comprising the above mentioned thermoplastic resin, the protective film forming layer follows the face where the protective film forming layer has transferred, and the void or so can be suppressed from occurring.

(B) The Curable Component

As the curable component (B), the thermosetting component and/or the energy ray curable component are used.

As the thermosetting component, the heat curing resin and heat curing agent are used. As the heat curing resin, for example the epoxy resin is preferable.

As the epoxy resin, the conventionally known epoxy resin can be used. As the epoxy resin, specifically, epoxy compound having two or more functional groups in the molecule such as polyfunctional epoxy resin, bisphenyl compound, bisphenol A diglycidylether and the hydrogenated product thereof, orthocresol novolak epoxy resin, dicyclopentadiene type epoxy resin, biphenyl type epoxy resin, bisphenol A type epoxy resin, bisphenol F type epoxy resin, phenylene backbone type epoxy resin or so may be mentioned. These may be used alone or by combining two or more thereof.

In the protective film forming layer, preferably 1 to 1000 parts by weight, more preferably 10 to 500 parts by weight, and particularly preferably 20 to 200 parts by weight of the heat curing resin is included with respect to 100 parts by weight of the binder polymer component (A). If the content of the heat curing resin is less than 1 part by weight, sufficient adhesiveness may not be obtained, and if it exceeds 1000 parts by weight, the release force between the protective film forming layer and the release strength adjusting layer increases, and transfer malfunction of the protective film forming layer may occur.

The heat curing agent functions as the curing agent against the heat curing resin, particularly against the epoxy resin. As preferable heat curing agent, the compound having, two or more functional groups capable of reacting with the epoxy group in one molecule may be mentioned. As such functional group, phenolic hydroxyl group, alcoholic hydroxyl group, amino group, carboxyl group, acid anhydride or so may be mentioned. Among these, preferably phenolic hydroxyl group, amino group, acid anhydride or so may be mentioned, and further preferably phenolic hydroxyl group and amino group may be mentioned.

As specific examples of the phenol based curing agent, polyfunctional phenol resin, biphenol, novolac phenol resin, dicyclopentadiene phenol resin, XYLOK phenol resin, aralkyl phenol resin or so may be mentioned. As for specific examples of amine curing agent, DICY (dicyandiamide) may be mentioned. These may be used alone or by mixing two or more thereof.

The content of the heat curing agent is preferably 0.1 to 500 parts by weight, and more preferably 1 to 200 parts by weight with respect to 100 parts by weight of the heat curing component. If the content of the heat curing agent is too little, the bonding property may not be obtained due to the insufficient curing, on the other hand if it is too much, then the moisture absorbing rate of the protective film forming layer increases and lowers the reliability of the semiconductor device.

As the energy ray curable component, the energy ray polymerizable group is included, and the low molecular weight compound can be used (energy ray polymerizable compound) which polymerize cure when the energy ray such as ultraviolet ray and the electron beam or so are irradiated. As such energy ray curable component, specifically an acrylate based compound such as trimethylolpropanetriacrylate, pentaerythritoltriacrylate, pentaerythritoltetraacrylate, dipentaerythritolmonohydroxypentaacrylate, dipentaerythritolhexaacrylate or 1,4-butyleneglycoldiacrylate, 1,6-hexanedioldiacrylate, polyethyleneglycoldiacrylate, oligoesteracrylate, urethaneacrylate oligomer, epoxy modified acrylate, polyetheracrylate and itaconic acid oligomer or so may be mentioned. Such compounds comprise at least one polymerizable double bond in the molecule, and usually the weight average molecular weight is 100 to 30000, preferably 300 to 10000 or so. The blending amount of the energy ray polymerizable compound is preferably 1 to 1500 parts by weight, more preferably 10 to 500 parts by weight, and particularly preferably 20 to 200 parts by weight with respect to 100 parts by weight of binder polymer component (A).

Also, as the energy ray curable component, the energy ray curable polymer wherein an energy ray polymerizable group is bonded to a main chain or a side chain of the binder polymer component (A) may be used. Such energy ray curable polymer has a function as the binder polymer component (A) and the function as the curable component (B).

The main backbone of the energy ray curable polymer is not particularly limited, and it may be acrylic polymer which is widely used as the binder polymer component (A). Also, it may be polyester, polyether or so, however it is preferable to have the acrylic polymer as the main backbone since it is easy to control the synthesis and the physical properties.

The energy ray curable polymer group bonded to the main chain or the side chain of the energy ray curable polymer is, for example, a group including energy ray curable carbon-carbon double bond; and specifically (meth)acryloyl group or so may be mentioned as an example. The energy ray polymerizable group may be bonded to the energy ray curable polymer via alkylene group, alkyleneoxy group, polyalkyleneoxy group.

The weight average molecular weight (Mw) of the energy ray curable polymer bonded with the energy ray polymerizable group is preferably 10000 to 2000000, more preferably 100000 to 1500000. Also, the glass transition temperature (Tg) of the energy ray curable polymer is preferably −60 to 50° C., more preferably −50 to 40° C., and particularly preferably −40 to 30° C.

The energy ray curable polymer is obtained by reacting acrylic based polymer having the functional group such as hydroxyl group, carboxyl group, amino group, substituted amino group, epoxy group or so, with the polymerizable group containing compound comprising the substituent group reacting with said functional group and 1 to 5 of the energy ray polymerizable carbon-carbon double bonds in one molecule. As the substituent group reacting with said functional group, isocyanate group, glycidyl group, carboxyl group or so may be mentioned.

As for the polymerizable group containing compound, (meth)acryloyloxyethyl isocyanate, metha-isopropenyl-α, α dimethylbenzyl isocyanate, (meth)acryloyl isocyanate, allyl isocyanate, glycidyl (meth)acrylate; (meth)acrylic acid or so may be mentioned.

The acrylic polymer is preferably a copolymer between (meth)acrylic monomer having the functional group of hydroxyl group, carboxyl group, amino group, substituted amino group, epoxy group and the like or the derivative thereof, with other (meth)acrylate monomer or the derivative thereof which is copolymerizable with said monomer.

As (meth)acrylic monomer having the functional group of hydroxyl group, carboxyl group, amino group, substituted amino group, epoxy group and the like or the derivative thereof, for example, 2-hydroxyethyl (meth)acrylate, 2-hydroxypropyl (meth)acrylate which has the hydroxyl group; acrylic acid, methacrylic acid, itaconic acid which has carboxyl group; glycidylmethacrylate, glycidyl acrylate which has epoxy group or so may be mentioned.

As other (meth)acrylate monomer or the derivative thereof copolymerizable with the above mentioned monomer, alkyl (meth)acrylate having carbon atoms of the alkyl group of 1 to 18, specifically, methyl (meth)acrylate, ethyl (meth)acrylate, propyl (meth)acrylate, butyl (meth)acrylate, 2-ethylhexyl (meth)acrylate or so; and as (meth)acrylate having a cyclic backbone, specifically cyclohexyl (meth) acrylate, benzyl (meth)acrylate, isobornyl acrylate, dicyclopentanyl acrylate, dicyclopentenyl acrylate, diclyopentenyloxyethyl acrylate, imide acrylate or so may be mentioned. Also, in above mentioned acrylic polymer, vinyl acetate, acrylonitrile, styrene or so may be copolymerized.

In case of using the energy ray curable polymer, said energy ray polymerizable compound may be used together, and also the binder polymer component (A) may be used together. The relation of the blending amount of these three in the protective film forming layer of the present invention is preferably 1 to 1500 parts by weight, more preferably 10 to 500 parts by weight, and particularly preferably 20 to 200 parts by weight of the energy ray polymerizable compound, with respect to 100 parts by weight of the sum of the energy ray curable polymer and the binder polymer component (A).

By providing the energy ray curable property to the protective film forming layer, the protective film forming layer can be cured easily in a short time, and the production efficiency of the chip with the protective film is improved. Conventionally, the protective film for the chip was generally formed by the heat curing resin such as epoxy resin or so; however the curing temperature of the heat curing resin was over 200° C., and it required about 2 hours to cure, hence it was an obstacle for improving the production efficiency. However, the energy ray curable protective film forming layer is capable of curing in a short time by energy ray irradiation, hence the protective film can be formed easily, which contributes to improve the production efficiency.

Other Components

The protective film forming layer may include the following components in addition to the above mentioned binder polymer component (A) and the curable component (B).

(C) The Coloring Agent

The protective film forming layer preferably comprises the coloring agent (C). By blending the coloring agent in the protective film forming layer, when the semiconductor devices are incorporated to the machines, the infrared ray or so generated by the surrounding devices can be blocked, thus the malfunction of the semiconductor device caused thereby can be prevented; and also the visibility of the characters such as the product number or so printed to the protective film is improved which is obtained by curing the protective film forming layer. That is, for the semiconductor device or the semiconductor chip formed with the protective film, usually the product number is printed on the surface of the protective film by laser marking method (the method of printing by grinding the surface of the protective film by the laser light), however as the protective film comprising the coloring agent (C), the sufficient contrast between the area of the protective film which is ground off by the laser, and those which is not ground off can be obtained, hence the visibility is improved. As the coloring agent (C), the organic or inorganic pigment and die are used. Among these, a black pigment is preferable from the point of the blocking property of the electromagnetic wave or the infrared ray. As for the black pigment, carbon black, iron oxide, manganese dioxide, aniline black, and activated carbon or so may be used, but it is not limited thereto. The carbon black is particularly preferable from the point of improving the reliability of the semiconductor device. The coloring agent (C) may be used alone, or by combining two or more thereof. The high curing property of the protective film forming layer of the present invention is particularly preferably exhibited when the ultraviolet ray transmittance rate has declined by using the coloring agent which reduces the transmittance of both of visible light and/or the infrared ray and the ultraviolet ray. As the coloring agent which reduces both of visible light and/or the infrared ray and the ultraviolet ray, besides the above mentioned black pigment, it is not particularly limited as long as it has absorbency or a reflectivity at both of the wave length range of visible light and/or the infrared ray and the ultraviolet ray.

The blending amount of the coloring agent (C) is preferably 0.1 to 35 parts by weight, more preferably 0.5 to 25 parts by weight, and most preferably 1 to 15 parts by weight with respect to 100 parts by weight of entire solid portion constituting the protective film forming layer.

(D) The Heat Curing Catalyst

The heat curing catalyst (D) is used to control the curing speed of the protective film forming layer. The heat curing catalyst (D) is preferably used in case the epoxy resin and the heat curing agent are used together in the curable component (B).

As the preferable heat curing catalyst, a tertiary amines such as triethylene diamine, benzyl dimethyl amine, triethanol amine, dimethylaminoethanol, tris(dimethylaminomethyl) phenol or so; imidazols such as 2-methylimidazol, 2-phenylimidazol, 2-phenyl-4-methylimidazol, 2-phenyl-4,5-dihydroxymethylimidazol, 2-phenyl-4-methyl-5-hydroxymethylimidazol or so; organic phosphine such as tributylphosphine, diphenylphosphine, triphenylphosine or so; tetraphenylboron salt such as tetraphenylphosphoniumtetraphenylborate, triphenylphosphinetetraphenylborate or so may be mentioned. These may be used alone or by mixing two or more thereof.

The heat curing catalyst (D) is included preferably within the range of preferably 0.01 to 10 parts by weight, more preferably 0.1 to 1 parts by weight, with respect to 100 parts by weight of curable component (B). By comprising the heat curing catalyst in the amount described in above range, it has excellent adhesive characteristic even if it is exposed under the high temperature high humidified condition; and also even if it is exposed to a harsh reflow condition, a high reliability can be still attained. If the content of the heat curing catalyst (D) is too little, a sufficient adhesive characteristic may not be obtained due to the insufficient curing, and if it is too much, then the heat curing catalyst having high polarity moves to the bonding boundary side in the protective film forming layer under a high temperature high humidified condition, and the reliability of the semiconductor device declines due to the segregation.

(E) The Coupling Agent

The coupling agent (E) may be used in order to improve the adhesiveness and the attachment property of the protective film forming layer against the chip, and/or the aggregation property of the protective film. Also, by using the coupling agent (E), without compromising the heat resistance of the protective film obtained by curing the protective film forming layer, the water resistance thereof can be improved.

As for the coupling agent (E), the compound comprising the group capable of reacting with the functional group comprised in the binder polymer component (A), and curable component (B) is preferably used. As for the coupling agent (E), silane coupling agent is preferable. As for such coupling agent, γ-glycidoxypropyltrimethoxy silane, γ-glycidoxypropylmethyldiethoxy silane, β-(3,4-epoxycyclohexyl)ethyltrimethoxy silane, γ-(methacryloxypropyl) trimethoxy silane, γ-aminopropyltrimethoxy silane, N-6-

(aminoethyl)-γ-aminopropyltrimethoxy silane, N-6-(aminoethyl)-γ-aminopropylmethyldiethoxy silane, N-phenyl-γ-aminopropyltrimethoxy silane, γ-ureidepropyltriethoxy silane, γ-melcaptopropyltrimethoxy silane, γ-melcaptopropylmethyldimethoxy silane, bis(3-triethoxysilylpropyl)tetrasulphone, methyltrimethoxy silane, methyltriethoxy silane, vinyltrimethoxy silane, vinyltriacetoxy silane, imidazol silane or so may be mentioned. These may be used alone or by mixing two or more thereof.

The coupling agent (E) is included preferably by proportion of usually 0.1 to 20 parts by weight, preferably 0.2 to 10 parts by weight, and more preferably 0.3 to 5 parts by weight with respect to 100 parts by weight of the total of the binder polymer component (A) and the curable component (B). If the content of the coupling agent (E) is less than 0.1 parts by weight, there is a chance that the above mentioned effect cannot be obtained, and if it exceeds 20 parts by weight, it may become a cause of generating the outgas.

(F) The Inorganic Filler

By blending the inorganic filler (F) in the protective film forming layer, it becomes possible to control the heat expansion coefficient of after the curing, thus the heat expansion coefficient of the protective film after the curing is optimized with respect to the semiconductor chip; thereby the reliability of the semiconductor device can be improved. Also, the moisture absorbing rate of the protective film after the curing can be reduced as well.

As the preferable inorganic filler, powders such as silica, alumina, talc, calcium carbonate, titanium oxide, iron oxide, silicon carbide, boron nitride or so, a beads of which these has been made into spherical form, a single crystal fiber and glass fiber or so may be mentioned. Among these, silica filler and alumina filler are preferable. The above mentioned inorganic filler (F) may be used alone or by mixing two or more thereof. The content of the inorganic filler (F) is adjustable within the range of usually 1 to 80 parts by weight with respect to 100 parts by weight of the entire solid portion constituting protective film forming layer.

(G) The Photopolymerization Initiator

In case the protective film forming layer comprises the energy ray curable component as the aforementioned curable component (B), upon using, the energy ray such as ultra violet ray or so is irradiated to cure the energy ray curable component. At this time, by comprising the photopolymerization initiator (G) in said composition, it can reduce the time for polymerizing and curing, and also the photo irradiation amount.

As specific examples of such photopolymerization initiator (G), benzophenone, acetophenone, benzoin, benzoinmethylether, benzomethylether, benzoinisopropylether, benoinisobutylether, benzoin benzoic acid, benzoin methyl benzoic acid, benzoindimethylketal, 2,4-diethylthioxanthone, α-hydroxycyclohexylphenylketone, benzyldiphenylsulphide, tetramethylthiurammonosulphide, azobisisobutyronitrile, benzil, dibenzil, diacetyl, 1,2-diphenylmethane, 2-hydroxy-2-methyl-1-[4-(1-methylvinyl)phenyl]propanone, 2,4,6-trimethylbenzoyldiphenylphosphineoxide, and β-chloranthraquinone or so may be mentioned. The photopolymerization initiator (G) may be used alone or by combining two or more thereof.

The blending amount of the photopolymerization initiator (G) is preferably 0.1 to 10 parts by weight, and more preferably 1 to 5 parts by weight with respect to 100 parts by weight of energy ray polymerizable component. If it is less than 0.1 parts by weight, a sufficient transferring property may not be obtained due to the insufficient photopolymerization, and if it exceeds 10 parts by weight, the residues which do not contribute the photopolymerization remains and the curing property of the protective film forming layer may be insufficient.

(H) The Crosslinking Agent

The crosslinking agent may be added in order to control the initial bonding force and the aggregation force of the protective film forming layer. As for the crosslinking agent (H), organic polyvalent isocyanate compound, organic polyvalent imine compound or so may be mentioned.

As for the above mentioned organic polyvalent isocyanate compound, aromatic polyvalent isocyanate compound, aliphatic polyvalent isocyanate compound, alicyclic polyvalent isocyanate compound and the trimer of the organic polyvalent isocyanate compound thereof, and terminal isocyanate urethane pre-polymer obtained by reacting these organic polyvalent isocyanate compounds and the polyol, may be mentioned.

As for the organic polyvalent isocyanate compound for example, 2,4-tolylenediisocyanate, 2,6-tolylenediisocyanate, 1,3-xylenediisocyanate, 1,4-xylenediisocyanate, diphenylmethane-4,4'-diisocyanate, diphenylmethane-2,4'-diisocyanate, 3-methyldiphenylmethanediisocyanate, hexamethylenediisocyanate, isophoronediisocyanate, dicyclohexylmethane-4,4'-diisocyanate, dicyclohexylmethane-2-4'-diisocyanate, trimethylolpropane adduct tolylenediisocyanate, and lysine isocyanate or so may be mentioned.

As for the above mentioned organic polyvalent imine compounds, N—N'-diphenylmethane-4,4'-bis(1-aziridinecarboxyamide), trimethylolpropane-tri-β-aziridinylpropionate, tetramethylolmethane-tri-β-aziridinylpropionate, and N,N'-toluene-2,4-bis(1-aziridinecarboxyamide) triethylenemelamine or so may be mentioned.

The crosslinking agent (H) is used in the ratio of usually 0.01 to 20 parts by weight, preferably 0.1 to 10 parts by weight, and more preferably 0.5 to 5 parts by weight with respect to total amount of 100 parts by weight of the binder polymer component (A) and the energy ray curable polymer.

(I) General Additives

Various additives may be blended depending on the needs, into the protective film forming layer besides the above described. As for the various additives, a leveling agent, a plasticizer, an antistatic agent, an antioxidizer, an ion scavenger, a gettering agent, a chain transfer agent or so may be mentioned.

The protective film forming layer formed from each component as described in the above has the bonding property and the curable property, and at the non-cured condition, it is easily bonded to the workpiece (the semiconductor wafer or chip or so) by pressing. By going through the curing, at the end, a protective film having high impact resistance can be provided, and having excellent bonding strength, further sufficient protection function can be maintained even under the harsh high temperature and high humidified condition. Note that, the protective film forming layer can be a single layer structure, or it may be multilayered structure only if one or more layer having above mentioned component is included.

The thickness of the protective film forming layer is not particularly limited, however it is preferably 3 to 300 μm, more preferably 5 to 250 μm, and particularly preferably 7 to 200 μm.

The maximum transmittance at the wave length of 300 to 1200 nm, which is the scale to indicate the transmittance of the visible light and/or the infrared ray and the ultraviolet ray of the protective film forming layer, is preferably 20% or less, more preferably 0 to 15%, even more preferably more than 0% and 10% or less, and particularly preferably 0.001 to 8%. By having the maximum transmittance of the protective film forming layer at the wave length of 300 to 1200 nm within the above mentioned range, the protective film forming layer has excellent curability in case the protective film forming layer comprises the energy ray curable component (particularly the ultraviolet ray curable component). Also, since the transmittance of the visible light wave length and the infrared wave length is too low, the effects of reducing the transmittance at the visible light wave length and/or the infrared ray range, the prevention of the malfunction caused by the infrared ray of the semiconductor wafer, and the improvements of visibility of the printings can be obtained. The maximum transmittance of the protective film forming layer at the wavelength of 300 to 1200 nm can be regulated by the above mentioned coloring agent (C). Note that, the maximum transmittance of the protective film forming layer is determined by measuring the total light transmittance at the 300 to 1200 nm of the cured protective film forming layer (the thickness of 25 μm), using UV-vis spectroscopy (made by Shimadzu Corporation), then the highest value of the transmittance rate was determined as the maximum transmittance.

(The Release Sheet)

The release sheet may be provided to the dicing sheet with the protective film forming layer, until it is to be used, in order to avoid the contact of the surface with the outside. As the release sheet, for example, a transparent film may be used such as, polyethylene film, polypropylene, film, polybutene film, polybutadiene film, polymethylpentene film, polyvinyl chloride film, vinyl chloride copolymer film, polyethyleneterephthalate film, polyethylenenaphthalate film, polybutyleneterephthalate film, polyurethane film, ethylene vinyl acetate copolymer film, ionomer resin film, ethylene.(meth)acrylic acid copolymer film, ethylene.(meth) acrylate copolymer film, polystyrene film, polycarbonate film, polyimide film, fluorine resin film or so. Also, the crosslinked film thereof may be used. Further, the multilayered film thereof may be used. Also, a colored film thereof, non-transparent film or so can be used as well. As for the release agent used for the release treatment, for example, the release agent of silicone based, fluorine based, long chain alkyl group containing carbamate or so may be mentioned.

The thickness of the release sheet is usually 10 to 500 μm, preferably 15 to 300 μm, and particularly preferably 20 to 250 μm or so. Also, the thickness of the resin film forming layer is usually 1 to 500 μm, preferably 5 to 300 μm, and particularly preferably 10 to 150 μm or so.

(The Dicing Sheet with the Protective Film Forming Layer)

As for the production method of the dicing sheet with the protective film forming layer, the following method may be mentioned. First, the protective film forming layer 5 is formed on the release strength adjusting layer 4. The protective film forming layer can be obtained by coating and drying the protecting film forming layer composition which is made by mixing the above mentioned components in an appropriate ratio in a suitable solvent, on the release strength adjusting layer. Also, the protective film forming layer composition can be coated and dried on the release sheet to form a film, then this is pasted against the release strength adjusting layer, and it can be held between the two sheets (the release strength adjusting layer/protective film forming layer/release sheet). When pasting the protective film forming layer to the release strength adjusting layer, it may be carried out together with the heat applying. At this time, it is preferable to carry out the heat applying at the temperature below the thermosetting temperature of the protective film forming layer, in case the protective film forming layer is thermosetting type.

Next, in case it is held between the two sheets, the release sheet is released. Then, the multilayered body of the protective film and the release strength adjusting layer is cut out to the same size as or a size larger than the workpiece (for example, the semiconductor wafer or so) to which the multilayered body is pasted; and the area surrounding the multilayered body being cut out in a circle is removed. Then, the circular release strength adjusting layer of the multilayered body is pasted to the adhesive layer 2 of the adhesive sheet 3 prepared separately, then the adhesive sheet is cut out in a concentric circular shape along the outer diameter of the margin of the adhesives against the ring frame, and the surrounding area of the adhesive sheet being cut out is removed; thereby the dicing sheet with the protective film forming layer of the present invention is obtained. In such case, after pasting the multilayered body to the adhesive layer 2 of the adhesive sheet 3, the release sheet may be pasted to the exposed protective film forming layer and the adhesive layer.

Also, as other method, while the protective film forming layer is held between the release strength adjusting layer and the release sheet, and leaving the release sheet attached, a half cut is made from the release strength adjusting layer side; then the multilayered body of the release strength adjusting layer/the protective film forming layer is cut out to the same size as or a size larger than the workpiece (for example, the semiconductor wafer or so) to which the multilayered body is pasted; and the redundant part is removed from the area surrounding the multilayered body being cut out in a circle. Then, the circular release strength adjusting layer of the multilayered body is pasted to the adhesive layer 2 of the adhesive sheet 3 prepared separately. Then, while leaving the release sheet attached, the adhesive sheet is cut out from the base film side in a concentric circular shape along the outer diameter of the margin of the adhesives against the ring frame; and the surrounding area of the adhesive sheet being cut out is removed; thereby the dicing sheet with the protective film forming layer of the present invention is obtained. In such case, the dicing sheet with protective film forming layer of the present invention is obtained on the release sheet while being pre-cut, and upon using, it is released from the release sheet, and the protective film forming layer side is pasted to the desired workpiece.

Also, in case the adhesive layer is formed by the energy ray curable adhesive agent, by selecting the range of irradiation of the energy ray, the part in the adhesive layer with reduced adhesive force at the predetermined position, size and shape, and the part in the adhesive layer of which the adhesive force is not reduced can be formed. Therefore, the energy ray is irradiated to reduce the adhesive force of the part where the ring frame of the adhesive layer is adhered; thereby the adhesive force can be regulated to a desired range. As a result, the adhesive layer having excellent adhesive property, and capable of preventing the adhesives from remaining on the ring frame can be obtained. Also, in the present invention, the release strength adjusting layer 4 and the protective film forming layer 5 are released, and the protective film forming layer 5 is transferred to the workpiece (chip) side. Therefore, the release strength between the release strength adjusting layer 4 and the adhesive sheet 3 is set to be larger than the release strength between the release strength adjusting layer 4 and the protective film forming layer 5. Thus, at the part where the release strength adjusting layer 4 is adhered, it is preferable that the adhesive force of the adhesive sheet does not decline. Hence, the energy ray is not irradiated to the part where the protective film forming layer of the adhesive layer is adhered, and preferably the adhesive force is maintained. Such partial curing of the adhesive layer is achieved by forming the protective mask on the base film 1 which partially blocks the energy ray, and irradiation of the energy ray from the base film side.

Also, on the margin of the adhesives (the adhesive layer exposed at the outer peripheral part of the adhesive sheet) of the ring frame, the both sided tape having a ring shape or the adhesive layer can be provided separately. The both sided tape has a constitution of the adhesive layer/the core material/the adhesive layer, and the adhesive layer of the both sided tape is not particularly limited, and the same adhesives of the above mentioned adhesive sheet can be used. Also, the core material preferably has the heat resistance, and as the core material, the film having the melting point of 120° C. or higher is preferably used. If the film having the melting point less than 120° C. is used as the core material, the core material may melt and cannot maintain the shape when heat curing the protective film forming layer, which may cause to fuse with the surrounding devices. As the core material, for example, polyester film, polypropylene film, polycarbonate film, polyimide film, fluorine resin film, and the liquid crystal polymer film or so can be preferably used.

In the above mentioned dicing sheet with the protective film forming layer, the total light transmittance at the wave length of 532 nm and the wave length of 1064 nm at the multilayered body part of the adhesive sheet and the release strength adjusting layer is preferably 70% or more, and more preferably 75% or more. By having the total light transmittance at the wave length of 532 nm and the wave length of 1064 nm at the multilayered body part of the adhesive sheet and the release strength adjusting layer within said range, the laser marking against the protective film can be carried out over the adhesive sheet after the dicing sheet with the protective film forming layer is adhered to the semiconductor wafer. Therefore, the laser marking can be carried out while the wafer is fixed to the dicing sheet, hence the wafer warpage is suppressed and the printing accuracy is improved.

In the dicing sheet with the protective film forming layer as mentioned in the above, the through hole which passes through the adhesive sheet and the release strength adjusting layer may be provided at the adhesive sheet and the release strength adjusting layer. By providing the through hole, the generation of the foreign matter can be suppressed which is caused by the gas generated during the laser marking to the protective film.

(The Production Method of the Chip)

Next, the method of the use of the dicing sheet with the protective film forming layer according to the present invention will be explained using the case of applying the sheet for the production of the chip (for example, the semiconductor chip or so).

The production method of the semiconductor chip using the dicing sheet with the protective film forming layer according to the present invention is characterized by adhering the protective film forming layer of the above sheet to the backside of the semiconductor wafer (a workpiece) formed with the circuit on the surface, and carrying out the following steps (1) to (3), to obtain the semiconductor chip comprising the protective film on the backside:

Step (1): obtaining the protective film by curing the protective film forming layer, Step (2): dicing the workpiece, and the protective film forming layer or the protective film, Step (3): releasing the protective film forming layer or the protective film from the release strength adjusting layer.

The production method of the semiconductor chip according to the present invention further includes the following step (4) in addition to the above mentioned steps (1) to (3), and step (4) is carried out at any time after said step (1).

Step (4): laser printing on the protective film.

The step (4) is preferably carried out between the step (1) and the step (2). By carrying out the laser printing to the protective film forming layer after it is cured, an excellent printing accuracy can be obtained. On the other, if it is carried out after step (2) and before step (3), there may be slight position shifting due to the dicing, hence the printing accuracy may decline. Also, in case it is carried out after step (3), the laser printing will be needed to each chips separately, hence the process becomes too complicated.

The semiconductor wafer may be a silicon wafer, or it may be a compound semiconductor wafer such as galium.arsenic or so. The formation of the circuit to the wafer surface can be carried out by various methods including the method conventionally used such as etching method, liftoff method or so. Next, the opposite face (the backside) of the circuit surface of the semiconductor wafer is ground. The method of grinding is not particularly limited, and the known means using the grinder or so may be used for grinding. During the backside grinding, to the circuit face for protecting the circuit of the surface, the adhesive sheet called surface protection sheet is adhered. The backside grinding is carried out by fixing the circuit face side of the wafer (that is the surface protection sheet side) to the chuck table or so, then grinding the backside which is not formed with the circuit using the grinder. The thickness of the wafer after the grinding is not particularly limited; however, usually it is 20 to 500 μm or so. Then, depending on the needs, the fracture layer caused during the backside grinding is removed. The removal of the fracture layer is done by chemical etching, plasma etching or so.

Next, on the backside of the semiconductor wafer, the protective film forming layer of the above mentioned dicing sheet with the protective film forming layer is adhered. Then, the steps of (1) to (3) are carried out in this order. In regards with the outline of this process, the similar step is described in Japanese Patent Article Laid Open No. 2002-280329, however it will be described in further detail in below.

First, the protective film forming layer of the above mentioned dicing sheet with the protective film forming layer is adhered to the backside of the semiconductor wafer to which the circuit is formed on the surface. Next, the protective film forming layer is cured, and the protective film is formed on the entire face of the wafer. The protective film forming layer is adhered before the curing, thereby the protective film forming layer nicely fits to the adhering face of the wafer, and the adhesiveness between the protective film and the semiconductor chip can be improved. Also, the shrinking deformation of the dicing sheet with the protective film forming layer is prevented which is caused during the curing of the protective film forming layer. In the protective film forming layer, the curable component (B) is included, thus generally, the protective film forming layer cures by heat curing or the energy ray irradiation. Note that, in case the thermosetting component and the energy ray curable component are blended in the protective film forming layer, the curing of the protective film forming layer can be carried out by both of heating and energy ray irradiation; and the curing by heating and energy ray irradiation can be carried out simultaneously, or it may be carried out sequentially. As a result, the protective film made of curable resin is formed at the wafer backside, and compared to the case of wafer alone, the strength is improved; thus the breakage of the thinned wafer during the handling can be reduced. Also, compared to the coating method wherein the coating solution for the protective film is directly coated to the backside of the wafer or chip and made into a film, the thickness of the protective film has excellent uniformity.

Next, it is preferable to laser print to the cured protective film forming layer (the protective film). The laser printing is carried out by a laser marking method, the product number is marked to the protective film by grinding off the surface of the protective film over the adhesive sheet by irradiating the laser beam. According to the dicing sheet with the protective film forming layer of the present invention, even if the wafer is extremely thin, the warpage of the wafer can be suppressed, thus the focus point of the laser beam is determined accurately, and the marking can be done precisely.

Next, the semiconductor wafer is diced for each circuit formed on the wafer surface. The dicing is carried out by cutting the wafer and the protective film both. The dicing is not particularly limited, and as an example, the method of fixing the surrounding part (the outer peripheral part of the adhesive sheet) of the dicing sheet of the protective film forming layer by the ring frame during the dicing of the wafer, then forming a chip of the wafer by known means such as by using the rotating circular blade such as the dicing blade or so may be mentioned. The dicing sheet with the protective film forming layer of the present invention comprises the release strength adjusting layer, and the protective film and the release strength adjusting layer has suitable strength, hence the movement of the chip moving due to the force applied from the dicing blade is unlikely to occur. The depth of cut by the dicing is sufficient enough as long as the wafer and the protective film are completely cut, and the release strength adjusting layer may be cut or it may not be cut. In case the release strength adjusting layer is not cut, the obtained chip is unlikely to shift the position. That is, even if the adhesive sheet 3 undergoes the thermal deformation during the curing of the protective film forming layer, the deformation of the adhesive sheet 3 does not influence all the way to the alignment of the chip, hence the chip alignment is maintained, and the pickup malfunction is reduced.

Further, if the above mentioned adhesive sheet 3 has sufficient heat resistance and the deformation of the adhesive sheet is small under the curing condition of the protective film forming layer, the release strength adjusting layer 4 can be completely cut when cutting the wafer and the protective film. By cutting the release strength adjusting layer 4, the dicing sheet of the present invention can be expanded even after the dicing, thus the space between the chips are widened and the pickup of the chip becomes easy.

After cutting the release strength adjusting layer 4, the above mentioned adhesive sheet is expanded. The adhesive sheet of the present invention has excellent elongation property, thus the dicing sheet with the protective film forming layer of the present invention has excellent expanding property, and the pickup property improves. Note that, even in case the release strength adjusting layer is not cut as mentioned in above, the chip alignment is maintained by the release strength adjusting layer, hence the chip can be picked up even without the expanding.

By picking up the diced semiconductor chip with the protective film using widely known means such as a collet or so, the protective film and the release strength adjusting layer are released at the boundary thereof. As a result, the semiconductor chip having the protective film at the backside (the semiconductor chip with the protective film) can be obtained. The dicing sheet with the protective film forming layer of the present invention comprises the release strength adjusting layer, thereby the pickup can be carried out easily without the protective film being strongly adhered to the adhesive layer or the base film. According to the present invention, the protective film with high uniformity of the thickness can be easily formed at the chip backside, thus the cracks caused during the dicing step or packaging becomes difficult to occur. Also, compared to the conventional steps wherein the wafer formed with the protective film is adhered to the dicing tape for dicing; according to the present invention, the chip with the protective film can be obtained without adhering to the dicing tape, thus the production steps can be made simple. Further, the semiconductor device can be produced by mounting the semiconductor chip on the predetermined substrate by face down method. Also, the semiconductor device can be produced by adhering the semiconductor chip comprising the protective film on the backside to other members (on the chip mounting member) such as the die pad part or other semiconductor chip or so.

EXAMPLE

Hereinafter, the present invention will be described based on the examples; however the present invention is not to be limited thereto. Note that, in the following examples, <the release strength between the release strength adjusting layer and the protective film>, <the thermal shrinkage ratio of the base film and the release strength adjusting layer>, <the thermosetting aptitude>, <the dicing aptitude>, and <the pickup aptitude> were measured and evaluated as below. Also, the following described <the protective film forming layer composition>, <the adhesive composition>, and <the release strength adjusting layer> were used.

<The Release Strength Between the Release Strength Adjusting Layer and the Protective Film>

For the dicing sheet with the protective film forming layer, the release strength between the release strength adjusting layer and the protective film was measured by the method mentioned in above. The curing of the protective film forming layer was carried out by introducing the wafer adhered with the dicing sheet with the protective film forming layer, to the heated oven at 130° C. for 2 hours.

<The Heat Curing Step Aptitude>

The protective film forming layer of the dicing sheet with the protective film forming layer was adhered to the polished face of the silicon wafer having the thickness of 350 μm, and the diameter of 6 inch and which was carried out with #2000 polishing. Next, the wafer adhered with the dicing sheet with the protective film forming layer was introduced to the heated oven at 130° C. for 2 hours; thereby the protective film forming layer was cured. When the releasing due to the deformation of the base film and the release strength adjusting layer did not occur between the protective film forming layer and the release strength adjusting layer (for the comparative example 2, it is the adhesive layer), then it was evaluated as "A"; and when the releasing occurred, then it was evaluated as "B".

<The Dicing Aptitude>

The protective film forming layer was cured as similar to the evaluation of the heat curing step aptitude. Next, by using the dicer (DFD651 made by DISCO Corporation), the wafer was diced into the chip size of 3 mm×3 mm so that a cut having the depth of 15 μm an was made into the base film at the blade speed of 40 mm/sec. During the dicing, when the chip did not move from the predetermined position, it was evaluated as "A", and when the chip was moved away due to the movement of the blade, then it was evaluated as "B".

<The Pickup Aptitude>

After carrying out the evaluation of the dicing aptitude, the pickup was done by die bonder (Bestem-D02, made by Canon Machinery Inc.); and when the pickup was able to be carried out, then it was evaluated as "A", on the other hand, when it was not possible, then it was evaluated as "B".

<The Thermal Shrinkage Ratio of the Base Film and the Release Strength Adjusting Layer>

The base film and the release strength adjusting layer were cut into 10 cm×10 cm, then it was introduced into the hot air oven (for 2 hours at 130° C.). Then, the base film and the release strength adjusting layer were taken out, and the size of the film was measured, then the thermal shrinkage ratio was obtained based on the following equation.

The thermal shrinkage ratio (%)={(the area of the film before the introduction)−(the area of the film after the introduction)}/the area of the film before the introduction×100

<The Protective Film Forming Layer>

The protective film forming layer (1): LC2850 (25) made by Lintec Corporation which is the protective film forming layer held between two release sheets was used.

The protective film forming layer (2): LC2822 H made by Lintec Corporation which is the protective film forming layer held between two release sheets was used.

<The Adhesive Composition>

The adhesive composition wherein 4 parts by weight of isocyanate based crosslinking agent (BHS-8515 made by TOYOCHEM CO., LTD.) was added to 100 parts by weight of acrylic based polymer having the weight average molecular weight of 600000 including 2-ethylhexylacrylate, methyl methacrylate, and 2-hydroxyethyl acrylate in the ratio of 84 wt %, 8 wt %, 8 wt % respectively as the constitution unit.

<The Base Film>

Polypropylene film with a thickness of 140 μm comprising a rough surface and a smooth surface; CT265 (made by Mitsubishi Plastics, Inc.)

<The Release Strength Adjusting Layer Film>

Polypropylene film with a thickness of 140 μm comprising a rough surface and a smooth surface; CT265 (made by Mitsubishi Plastics, Inc.)

Example 1

One of the release sheets was released from the protective film forming layer (1), and the release strength adjusting layer film was stacked on the protective film forming layer by facing the smooth face while heating at 70° C. The protective film forming layer and the release strength adjusting layer was cut out as the same size as the silicon wafer (the diameter of 6 inch) while leaving the release sheet; and the multilayered body of the protective film forming layer/ the release strength adjusting layer being cut out in a circle was obtained.

On to the release sheet for the adhesive sheet (SP-PET 381031, made by Lintec Corporation), the above mentioned adhesive composition solution was coated and dried (the drying condition: 120° C. for 3 minutes in the oven) so that the thickness after drying was 10 μm; then by adhering the base film and the adhesive layer, the adhesive layer was formed on the base film, thereby the adhesive sheet provided with the release sheet was obtained.

The release sheet was removed from the above mentioned adhesive sheet, and the release strength adjusting layer side of the above described multilayered body of the protective film forming layer and the release strength adjusting layer were adhered on the adhesive layer. Then, while the release sheet was left, the adhesive sheet was cut out in a concentric circular shape along the outer diameter (the diameter of 205 mm) of the margin of the adhesives with respect to the ring frame. Then, the release sheet on the protective film forming layer was released; thereby the dicing sheet with the protective film forming layer was obtained. The results are shown in Table 1.

Example 2

The dicing sheet with the protective film forming layer was obtained as same as the example 1 except for using the protective film forming layer (2) as the protective film forming layer. Each evaluation results are shown in Table 1.

Example 3

The dicing sheet with the protective film forming layer was obtained as same as the example 1, except for using the protective film forming layer (2) as the protective film forming layer, and stacking the release strength adjusting layer film on the protective film forming layer by facing the rough surface. Each evaluation results are shown in Table 1.

Example 4

The dicing sheet with the protective film forming layer was obtained as same as the example 1, except for using polyethyleneterephthalate film (T100 made by Mitsubishi Plastics, Inc.), and using polypropylene film (FOP-K made by FUTAMURA CHEMICAL CO., LTD.) of the thickness of 50 μm comprising the smooth surface and the rough surface as the release strength adjusting layer film. Each evaluation results are shown in Table 1.

Comparative Example 1

The dicing sheet with the protective film forming layer was obtained as same as the example 1, except for using the protective film forming layer (2) as the protective film forming layer, and using polybutyleneterephthalate film (XOFL made by OG CORPORATION.) of the thickness of 50 μm comprising the smooth surface and the rough surface as the release strength adjusting layer film, and further stacking the release strength adjusting layer film on the protective film forming layer by facing the rough surface. Each evaluation results are shown in Table 1.

Comparative Example 2

The dicing sheet with the protective film forming layer was obtained as same as the example 1, except for not using the release strength adjusting layer. Each evaluation results are shown in Table 1.

Comparative Example 3

The dicing sheet with the protective film forming layer was obtained as same as the example 1, except for using polyethyleneterephthalate film (SP-PET 381031, made by Lintec Corporation) of the thickness is 38 μm wherein one side was release treated, and stacking the release strength adjusting layer film on the protective film forming layer by facing the release treated surface. For this dicing sheet with the protective film forming layer, during the evaluation of the dicing aptitude, the chip was moved away by the movement of the blade; thus the pickup aptitude evaluation was unable to carry out. Each evaluation results are shown in Table 1.

TABLE 1

|  | Example 1 | Example 2 | Example 3 | Example 4 | Comparative example 1 | Comparative example 2 | Comparative example 3 |
|---|---|---|---|---|---|---|---|
| Release strength adjusting layer | CT265 | CT265 | CT265 | FOP-K | XOFL | None | SP-PET 381031 |
| The face where the protective film forming layer of the release strength adjusting layer was provided | Smooth face | Smooth face | Rough face | Smooth face | Rough face | — | Release treated face |
| Base film | CT265 | CT265 | CT265 | T100 | CT265 | CT265 | CT265 |
| Protective film forming layer | (1) | (2) | (2) | (1) | (2) | (1) | (1) |
| The release strength between the release strength adjusting layer and the protective film [N/25 mm] | 0.08 | 0.63 | 2.07 | 0.78 | 6.41 | — | 0.03 |
| The thermal shrinkage ratio of the release strength adjusting layer [%] | 2.58 | 2.58 | 2.58 | 6.49 | 0.50 | — | 1.30 |
| The thermal shrinkage ratio of the base film [%] | 2.58 | 2.58 | 2.58 | 1.10 | 2.58 | 2.58 | 2.58 |
| Thermosetting aptitude | A | A | A | A | A | A | A |
| Dicing aptitude | A | A | A | A | A | A | B |
| Pickup aptitude | A | A | A | A | B | B | — |

1 . . . Base film
2 . . . Adhesive layer
3 . . . Adhesive sheet
4 . . . Release strength adjusting layer
5 . . . Protective film forming layer
10 . . . Dicing sheet with the protective film forming layer

The invention claimed is:

1. A dicing sheet with a protective film forming layer comprising:
   an adhesive sheet formed of a base film and an adhesive layer, wherein the protective film forming layer is formed on the adhesive layer via a release strength adjusting layer,
   a multilayered body formed of the release strength adjusting layer and the protective film forming layer is formed at an inner peripheral part of the adhesive sheet, and
   the adhesive layer is uncovered by both the release strength adjusting layer and the protective film forming layer at an outer peripheral part of the adhesive sheet and a release strength between the release strength adjusting layer and a protective film formed by curing the protective film forming layer is 0.05 to 5 N/25 mm.

2. The dicing sheet with the protective film forming layer as set forth in claim 1 wherein a thermal shrinkage ratio of the release strength adjusting layer under heating at 130° C. for 2 hours is −5 to +5%.

3. The dicing sheet with the protective film forming layer as set forth in claim 1, a thermal shrinkage ratio of the base film under a heating at 130° C. for 2 hours is −5 to +5%.

4. The dicing sheet with the protective film forming layer as set forth in claim 1, wherein a total light transmittance of a multilayered body part formed of the adhesive sheet and the release strength adjusting layer is 70% or more at a wave length of 532 nm and 1064 nm.

5. The dicing sheet with the protective film forming layer as set forth in claim 1, wherein said protective film forming layer comprises a binder polymer component and a curable component.

6. The dicing sheet with the protective film forming layer as set forth in claim 1, wherein said protective film forming layer comprises a coloring agent, and a maximum transmittance of the protective film forming layer is 20% or less at a wave length of 300 to 1200 nm.

7. A production method of a chip wherein:
   a protective film forming layer of a dicing sheet is adhered to a workpiece, and following steps (1) to (3) are carried out in this order:
   Step (1): obtaining the protective film by curing the protective film forming layer,
   Step (2): dicing the workpiece, and the protective film,
   Step (3): releasing the protective film from the release strength adjusting layer;
   wherein said dicing sheet with the protective film forming layer comprises:
   an adhesive sheet formed of a base film and an adhesive layer, wherein the protective film forming layer is formed on the adhesive layer via a release strength adjusting layer,
   a multilayered body formed of the release strength adjusting layer and the protective film forming layer is formed at an inner peripheral part of the adhesive sheet, and
   the adhesive layer is uncovered by both the release strength adjusting layer and the adhesive layer at an outer peripheral part of the adhesive sheet and a release strength between the release strength adjusting layer and the protective film formed by curing the protective film forming layer is 0.05 to 5 N/25 mm.

8. The production method of the chip as set forth in claim 7, wherein following step (4) is carried out at any time after said step (1):
   Step (4): laser printing on the protective film.

9. The production method of the chip as set forth in claim 7 wherein the release strength adjusting layer is carried out with a full cut at said step (2).

10. The dicing sheet with a protective film forming layer as set forth in claim 1, wherein the release strength adjusting layer comprises a polyolefin-based film.

11. A dicing sheet, comprising:
an adhesive sheet comprising a base film and an adhesive layer;
a release strength adjusting layer on an inner part of the adhesive layer; and
a cured protective film forming layer on the release strength adjusting layer,
wherein an outer part of the adhesive layer is uncovered by both the release strength adjusting layer and the cured protective film forming layer; and
wherein a release strength between the release strength adjusting layer and the cured protective film forming layer is 0.05 to 5 N/25 mm.

* * * * *